(12) United States Patent
Tan et al.

(10) Patent No.: US 7,196,021 B2
(45) Date of Patent: *Mar. 27, 2007

(54) HDP-CVD DEPOSITION PROCESS FOR FILLING HIGH ASPECT RATIO GAPS

(75) Inventors: Zhengquan Tan, Cupertino, CA (US); Dongqing Li, Santa Clara, CA (US); Walter Zygmunt, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 78 days.

This patent is subject to a terminal disclaimer.

(21) Appl. No.: 11/095,704

(22) Filed: Mar. 30, 2005

(65) Prior Publication Data

US 2005/0181632 A1    Aug. 18, 2005

Related U.S. Application Data

(63) Continuation of application No. 10/763,018, filed on Jan. 21, 2004, now Pat. No. 6,914,016, which is a continuation of application No. 09/854,083, filed on May 11, 2001, now Pat. No. 6,740,601.

(51) Int. Cl.
*H01L 21/31* (2006.01)
(52) U.S. Cl. .................. 438/788; 438/787; 438/774
(58) Field of Classification Search ............. 438/784, 438/783, 787, 788; 257/E21.276
See application file for complete search history.

(56) References Cited

U.S. PATENT DOCUMENTS

| 4,572,841 A | 2/1986 | Kaganowicz et al. |
| 4,667,365 A | 5/1987 | Martinek |

(Continued)

FOREIGN PATENT DOCUMENTS

EP    0 822 585 A2    2/1998

(Continued)

OTHER PUBLICATIONS

Carl et al. "The Effect of O2:C2F6 ratios and two frequency poser on the gap fill properties and stability of F-TEOS films", DUMIC Conference, Feb. 21-22, 1995, pp. 234-240.

(Continued)

*Primary Examiner*—Michael Trinh
(74) *Attorney, Agent, or Firm*—Townsend and Townsend and Crew LLP (57) ABSTRACT

A method for forming a silicon oxide layer over a substrate disposed in a high density plasma substrate processing chamber. The method includes flowing a process gas that includes a silicon-containing source, an oxygen-containing source and a fluorine-containing source into the substrate processing chamber and forming a plasma from said process gas. The substrate is heated to a temperature above 450° C. during deposition of said silicon oxide layer and the deposited layer has a fluorine content of less than 1.0 atomic percent.

14 Claims, 8 Drawing Sheets

U.S. PATENT DOCUMENTS

| | | |
|---|---|---|
| 4,690,746 A | 9/1987 | McInerney et al. |
| 4,737,379 A | 4/1988 | Hudgens et al. |
| 4,835,005 A | 5/1989 | Hirooka et al. |
| 4,872,947 A | 10/1989 | Wang et al. |
| 4,890,575 A | 1/1990 | Ito et al. |
| 4,892,753 A | 1/1990 | Wang et al. |
| 4,894,352 A | 1/1990 | Lane et al. |
| 4,960,488 A | 10/1990 | Law et al. |
| 5,000,113 A | 3/1991 | Wang et al. |
| 5,013,691 A | 5/1991 | Lory et al. |
| 5,045,346 A | 9/1991 | Tabasky et al. |
| 5,068,124 A | 11/1991 | Batey et al. |
| 5,089,442 A | 2/1992 | Olmer |
| 5,156,881 A | 10/1992 | Okano et al. |
| 5,270,264 A | 12/1993 | Andideh et al. |
| 5,271,972 A | 12/1993 | Kwok et al. |
| 5,275,977 A | 1/1994 | Otsubo et al. |
| 5,279,865 A | 1/1994 | Chebi et al. |
| 5,302,233 A | 4/1994 | Kim et al. |
| 5,314,724 A | 5/1994 | Tsukune et al. |
| 5,319,247 A | 6/1994 | Matsuura |
| 5,362,526 A | 11/1994 | Wang et al. |
| 5,413,967 A | 5/1995 | Matsuda et al. |
| 5,416,048 A | 5/1995 | Blalock et al. |
| 5,456,796 A | 10/1995 | Gupta et al. |
| 5,468,342 A | 11/1995 | Nulty et al. |
| 5,507,881 A | 4/1996 | Sichanugrist et al. |
| 5,525,550 A | 6/1996 | Kato |
| 5,563,105 A * | 10/1996 | Dobuzinsky et al. ....... 438/784 |
| 5,571,571 A | 11/1996 | Musaka et al. |
| 5,571,576 A | 11/1996 | Qian et al. |
| 5,571,578 A | 11/1996 | Kaji et al. |
| 5,589,233 A | 12/1996 | Law et al. |
| 5,593,741 A | 1/1997 | Ikeda |
| 5,599,740 A | 2/1997 | Jang et al. |
| 5,614,055 A | 3/1997 | Fairbairn et al. |
| 5,621,241 A | 4/1997 | Jain |
| 5,624,582 A | 4/1997 | Cain |
| 5,629,043 A | 5/1997 | Inaba et al. |
| 5,637,190 A | 6/1997 | Liso |
| 5,643,640 A | 7/1997 | Chakravarti et al. |
| 5,645,645 A | 7/1997 | Zhang et al. |
| 5,679,606 A | 10/1997 | Wang et al. |
| 5,712,185 A | 1/1998 | Tsai et al. |
| 5,719,085 A | 2/1998 | Moon et al. |
| 5,728,621 A | 3/1998 | Zheng et al. |
| 5,750,211 A | 5/1998 | Weise et al. |
| 5,776,557 A | 7/1998 | Okano et al. |
| 5,786,039 A | 7/1998 | Brouquet |
| 5,804,259 A | 9/1998 | Robles |
| 5,807,785 A | 9/1998 | Ravi |
| 5,849,455 A | 12/1998 | Ueda et al. |
| 5,850,105 A | 12/1998 | Dawson et al. |
| 5,858,876 A | 1/1999 | Chew |
| 5,869,149 A | 2/1999 | Denison et al. |
| 5,872,052 A | 2/1999 | Iyer |
| 5,872,058 A | 2/1999 | Van Cleemput et al. |
| 5,874,350 A | 2/1999 | Nakagawa |
| 5,903,106 A | 5/1999 | Young et al. |
| 5,910,342 A | 6/1999 | Hirooka et al. |
| 5,913,140 A | 6/1999 | Roche et al. |
| 5,915,190 A | 6/1999 | Pirkle |
| 5,937,323 A | 8/1999 | Orczyk et al. |
| 5,953,635 A | 9/1999 | Andideh |
| 5,968,610 A | 10/1999 | Liu et al. |
| 5,976,327 A | 11/1999 | Tanaka |
| 5,990,000 A | 11/1999 | Hong et al. |
| 5,990,013 A | 11/1999 | Berenguer et al. |
| 6,001,728 A | 12/1999 | Bhan et al. |
| 6,004,831 A | 12/1999 | Yamazaki et al. |
| 6,013,191 A | 1/2000 | Nasser-Faili et al. |
| 6,013,584 A | 1/2000 | M'Saad |
| 6,020,458 A | 2/2000 | Lee et al. |
| 6,030,666 A | 2/2000 | Lam et al. |
| 6,030,881 A | 2/2000 | Papasouliotis et al. |
| 6,037,018 A | 3/2000 | Jang et al. |
| 6,039,851 A | 3/2000 | Iyer |
| 6,042,901 A | 3/2000 | Denison et al. |
| 6,051,321 A | 4/2000 | Lee et al. |
| 6,057,242 A | 5/2000 | Kishimoto |
| 6,059,643 A | 5/2000 | Hu et al. |
| 6,070,551 A | 6/2000 | Li et al. |
| 6,071,573 A | 6/2000 | Koemtzopoulos et al. |
| 6,074,959 A | 6/2000 | Wang et al. |
| 6,077,764 A * | 6/2000 | Sugiarto et al. ............ 438/597 |
| 6,077,786 A | 6/2000 | Chakravarti et al. |
| 6,090,167 A | 7/2000 | Bhan et al. |
| 6,096,646 A | 8/2000 | Lee et al. |
| 6,106,678 A | 8/2000 | Shufflebotham et al. |
| 6,136,685 A | 10/2000 | Narwankar et al. |
| 6,147,009 A | 11/2000 | Grill et al. |
| 6,149,779 A | 11/2000 | Van Cleemput et al. |
| 6,149,976 A | 11/2000 | Matsuki et al. |
| 6,149,986 A | 11/2000 | Shibata et al. |
| 6,150,212 A | 11/2000 | Divakaruni et al. |
| 6,150,285 A | 11/2000 | Besser et al. |
| 6,167,834 B1 | 1/2001 | Wang et al. |
| 6,170,428 B1 | 1/2001 | Redeker et al. |
| 6,174,808 B1 | 1/2001 | Jang et al. |
| 6,182,602 B1 | 2/2001 | Redeker et al. |
| 6,184,158 B1 | 2/2001 | Shufflebotham et al. |
| 6,189,483 B1 | 2/2001 | Ishikawa et al. |
| 6,190,233 B1 | 2/2001 | Hong et al. |
| 6,191,026 B1 | 2/2001 | Rana et al. |
| 6,194,037 B1 | 2/2001 | Terasaki et al. |
| 6,194,038 B1 | 2/2001 | Rossman |
| 6,197,691 B1 | 3/2001 | Lee |
| 6,197,705 B1 | 3/2001 | Vassiliev |
| 6,200,412 B1 | 3/2001 | Kilgore et al. |
| 6,203,863 B1 | 3/2001 | Liu et al. |
| 6,217,658 B1 | 4/2001 | Orczyk et al. |
| 6,224,950 B1 | 5/2001 | Hirata |
| 6,228,751 B1 | 5/2001 | Yamazaki et al. |
| 6,230,650 B1 | 5/2001 | Yamazaki |
| 6,232,196 B1 | 5/2001 | Raaijmakers et al. |
| 6,255,057 B1 | 7/2001 | Jang |
| 6,258,407 B1 | 7/2001 | Lee et al. |
| 6,268,297 B1 | 7/2001 | Nag et al. |
| 6,313,010 B1 | 11/2001 | Nag et al. |
| 6,326,064 B1 | 12/2001 | Denison et al. |
| 6,335,288 B1 | 1/2002 | Kwan et al. |
| 6,346,302 B2 * | 2/2002 | Kishimoto et al. ......... 427/569 |
| 6,355,581 B1 | 3/2002 | Vassiliev et al. |
| 6,372,291 B1 | 4/2002 | Hua et al. |
| 6,383,896 B1 | 5/2002 | Kirimura et al. |
| 6,395,150 B1 | 5/2002 | Van Cleemput et al. |
| 6,416,823 B2 | 7/2002 | Li et al. |
| 6,465,044 B1 | 10/2002 | Jain et al. |
| 6,486,487 B2 | 11/2002 | Tanabe |
| 6,503,843 B1 | 1/2003 | Xia et al. |
| 6,531,193 B2 | 3/2003 | Fonash et al. |
| 6,537,832 B2 | 3/2003 | Otsubo et al. |
| 6,537,929 B1 | 3/2003 | Cheung et al. |
| 6,551,940 B1 | 4/2003 | Ko |
| 6,559,026 B1 | 5/2003 | Rossman et al. |
| 6,589,610 B2 | 7/2003 | Li et al. |
| 6,589,611 B1 | 7/2003 | Li et al. |
| 6,596,653 B2 | 7/2003 | Tan et al. |
| 6,596,654 B1 | 7/2003 | Bayman et al. |
| 6,607,983 B1 | 8/2003 | Chun et al. |
| 6,626,188 B2 | 9/2003 | Fitzsimmons et al. |
| 6,639,264 B1 * | 10/2003 | Loh ........................ 257/301 |
| 6,653,203 B1 | 11/2003 | Huang et al. |
| 6,673,722 B1 | 1/2004 | Yamazaki |

| | | | |
|---|---|---|---|
| 6,713,390 B2 | 3/2004 | M'Saad et al. | |
| 6,740,601 B2* | 5/2004 | Tan et al. | 438/771 |
| 6,794,290 B1 | 9/2004 | Papasouliotis et al. | |
| 6,903,031 B2* | 6/2005 | Karim et al. | 438/787 |
| 6,914,016 B2* | 7/2005 | Tan et al. | 438/788 |
| 2001/0028924 A1 | 10/2001 | Sherman | |
| 2001/0033900 A1 | 10/2001 | M'Saad et al. | |
| 2002/0187655 A1 | 12/2002 | Tan | |
| 2002/0192396 A1 | 12/2002 | Wang et al. | |
| 2003/0056900 A1 | 3/2003 | Li et al. | |
| 2003/0159656 A1 | 8/2003 | Tan et al. | |
| 2003/0203637 A1 | 10/2003 | Hua et al. | |
| 2003/0219540 A1 | 11/2003 | Law et al. | |
| 2004/0146661 A1 | 7/2004 | Kapoor et al. | |
| 2004/0166694 A1 | 8/2004 | Won et al. | |

FOREIGN PATENT DOCUMENTS

| | | |
|---|---|---|
| EP | 0 883 166 A2 | 9/1998 |
| GB | 2 267 291 | 12/1993 |
| JP | 2058836 A | 2/1990 |
| JP | 7-161703 A | 6/1995 |

OTHER PUBLICATIONS

Fukada et al. "Preparation of SiOF Films with Low Dielectric Constant By ECR Plasma CVD", Japan. DUMIC Conference. Feb. 1995. pp. 43-49.

Fukuda, T. et al., "Highly Reliable SIOF Film Formation Using High Density Plasma Containing Hydrogen," Feb. 10-11, 1997 DUMIC Conference, pp. 41-49 (Feb. 1997).

Lee, G.Y. et al., "A Low Redeposition Rate High Density Plasma CVD Process for High Aspect Ratio 175 mm Technology and Beyond," Proceedings of IEEE 1999 International Interconnect Technology Conference, pp. 152-154 (1999).

Musaka, "Single Step Gap Filling Technology fo Subhalf Micron Metal Spacings on Plasma Enhanced TEOS/O2 Chemical Vapor Deposition System," International Conference on Solid State Devices and Materials pp. 510-512, held in Japan, (1993).

Nalwa, H.S., *Handbook of Low and High Dielectric Constant Materials and Their Applications*, vol. 1, p. 66 (1999).

Nguyen, s.v., "High-Density Plasma Chemical Vapor Deposition of Silicon-Based Dielectric Films for Integrated Circuits," Journal of Research and Development, vol. 43, 1/2 (1999).

Qian et al., "High Density Plasma Deposition and Deep Submicron Gap Fill with Low Dielectric Constant SiO2 Films," DUMIC Conference, Feb. 21-22, 1995, pp. 50-56, held in California.

Shapiro et al. "Dual Frequency Plasma CVD Fluorosilicate Glass: Water Absorption And Stability", DUMIC Conference. Feb. 1995. pp. 118-123.

Vassiliev et al., "Trends in void-free pre-metal CVD dielectrics," Solid State Technology, Mar. 2001, pp. 129-136, www.solid-state.com.

Vassiliev et al., "Properties and Gap-Fill Capability of HPD-CVD Phosphosilicate Glass Films for Subquarter-Micrometer ULSI Device Technology" Electrochemical and Solid-State Letters 3 (2), 2000, pp. 80-83.

Wolf, Stanley, Silicon Processing for the VLSI Era, vol. 2, pp. 198-199 (1990).

Yu et al. "Step Coverage Study of Peteos Deposition for Intermetal Dielectric Applications", VMIC Conference. Jun. 1990. pp. 166-172.

Abraham, "Reactive Facet Tapering of Plasma Oxide For Multilevel Interconnect Applications," VMIC Conference. pp. 115-121 (1987).

Lee et al., "Dielectric Planarization Techniques For Narrow Pitch Multilevel Interconnects," VMIC Conference, pp. 85-92 (1987).

Nalwa, H.S., Handbook of Low and High Dielectric Constant Materials and Their Applications, vol. 1, p. 66 (1999.

* cited by examiner

ary steps in the fabrication of modern
HDP-CVD DEPOSITION PROCESS FOR FILLING HIGH ASPECT RATIO GAPS This application is a continuation of U.S. patent application Ser. No. 10/763,018, filed Jan. 21, 2004, now U.S. Pat. No. 6,914,016, which is a continuation of U.S. patent application Ser. No. 09/854,083, filed May 11, 2001, now U.S. Pat. No. 6,740,601, the entire disclosures of each of which are incorporated herein by reference for all purposes.

BACKGROUND OF THE INVENTION

One of the primary steps in the fabrication of modern semiconductor devices is the formation of a film, such as a silicon oxide, on a semiconductor substrate. Silicon oxide is widely used as an insulating layer in the manufacture of semiconductor devices. As is well known, a silicon oxide film can be deposited by thermal chemical vapor deposition (CVD) or a plasma chemical vapor deposition processes among other techniques. In a conventional thermal CVD process, reactive gases are supplied to the substrate surface where heat-induced chemical reactions (homogeneous or heterogeneous) take place to produce a desired film. In a conventional plasma process, a controlled plasma is formed to decompose and/or energize reactive species to produce the desired film.

Semiconductor device geometries have dramatically decreased in size since such devices were first introduced several decades ago. Smaller feature sizes have resulted in the presence of increased aspect ratio gaps for some applications, for example, between adjacent conductive lines or in etched trenches. The aspect ratio of a gap is defined by the ratio of the gap's height or depth to its width. These spaces are difficult to fill using conventional CVD methods. A film's ability to completely fill such gaps is referred to as the film's "gap-filling" ability. Silicon oxide is one type of insulation film that is commonly used to fill the gaps in intermetal dielectric (IMD) applications, premetal dielectric (PMD) applications and shallow trench isolation (STI) applications among others. Such a silicon oxide film is often referred to as a gap-fill film or a gap-fill layer.

Some integrated circuit manufacturers have turned to the use of high density plasma CVD (HDP-CVD) systems to deposit silicon oxide gap-fill layers. HDP-CVD systems form a plasma that is approximately two orders of magnitude or greater than the density of a standard, capacitively-coupled plasma CVD system. Examples of HDP-CVD systems include inductively-coupled plasma systems and electron cyclotron resonance (ECR) plasma systems among others. HDP-CVD systems generally operate at lower pressure ranges than low density plasma systems. The low chamber pressure employed in HDP-CVD systems provides active species having a long mean-free-path and reduced angular distribution. These factors, in combination with the plasma's density, contribute to a significant number of constituents from the plasma reaching even the deepest portions of closely spaced gaps, providing a film with improved gap-fill capabilities as compared to films deposited in a low density plasma CVD system.

Another factor that allows films deposited by HDP-CVD techniques to have improved gap-fill characteristics as compared to films deposited by other CVD techniques is the occurrence of sputtering, promoted by the plasma's high density, simultaneous with film deposition. The sputtering element of HDP deposition slows deposition on certain features, such as the corners of raised surfaces, thereby contributing to the increased gap-fill ability of HDP deposited films. Some HDP-CVD systems introduce argon or a similar heavy inert gas to further promote the sputtering effect. These HDP-CVD systems typically employ an electrode within the substrate support pedestal that enables the creation of an electric field to bias the plasma toward the substrate. The electric field can be applied throughout the HDP deposition process to generate sputtering and provide better gap-fill characteristics for a given film.

One HDP-CVD process commonly used to deposit a silicon oxide film forms a plasma from a process gas that includes silane ($SiH_4$), molecular oxygen ($O_2$) and argon (Ar). This silicon oxide film has improved gap-fill characteristics as opposed to some silicon oxide films deposited by other non-HDP-CVD plasma techniques and is useful for a variety of applications. Despite the improvement in gap-fill capability provided by HDP-CVD systems and the relatively good gap-fill characteristics of HDP-CVD silicon oxide films in particular, the development of film deposition techniques that enable the deposition of silicon oxide layers having even further improved gap-fill characteristics are desirable. Such improved silicon oxide film deposition are particularly desirable in light of the aggressive gap-fill challenges presented by integrated circuit designs employing minimum feature sizes of 0.18 microns and less.

One known way to improve the gap-fill capability of silicon oxide films is to add a fluorine-containing source gas to the process gas. Fluorine atoms are known to etch silicon oxide and it is known that the inclusion of fluorine into a silicon oxide deposition process results in etching simultaneous with deposition which in turn can improve the deposited film's gap-fill capability. The incorporation of fluorine into a silicon oxide film also has a primary benefit of reducing the dielectric constant of the deposited film. A silicon oxide film (also referred to as a silicate glass layer) that includes fluorine is often referred to in the industry as a fluorine-doped silicon oxide film or as a fluorosilicate glass (FSG) layer.

It is also known that the dielectric constant of an FSG layer is generally related to the amount of fluorine incorporated into the film. Higher fluorine concentrations result in a lower dielectric constant and lower fluorine concentrations a higher dielectric constant. If fluorine concentrations become too high, however, stability issues may arise. Generally, FSG films having sufficient stability for integrated circuit applications have a fluorine content of between 4–8 atomic percent and a dielectric constant between 3.3 and 3.6. Undoped silicon oxide films, on the other hand, generally have a dielectric constant in the range of 4.0 and 4.2.

Because of stability and other issues, FSG films are generally not used for PMD or STI applications and have been primarily limited to intermetal dielectric (IMD) applications. Semiconductor manufacturers are often particularly hesitant to include fluorine in PMD and STI layers because such layers are likely to be subject to relatively high temperatures (e.g., above 500° C. and often above 700° C.) either during deposition of the layer or during a process step that is subsequent to deposition of the layer. At such high temperatures, fluorine is more likely to outgas from FSG layers and migrate into an adjacent layer. Thus, many semiconductor manufacturers require that PMD or STI layers have less than 1.0 atomic percent (at. %) fluorine. IMD layers, on the other hand, are typically deposited after the first metal layer and thus never subject temperatures above 450° C.

Typically, undoped silicate glass (USG) or other silicon oxide family members including BPSG (borophosphosilicate glass) and PSG (phosphosilicate glass) are used for PMD layers and USG is used for STI applications. In view of the above, additional methods of depositing PMD and STI silicon oxide films including USG, PSG and BPSG films having improved gap-fill capabilities are desirable.

BRIEF SUMMARY OF THE INVENTION

Embodiments of the present invention pertain to a method and apparatus for depositing PMD and STI silicon oxide films having improved gap-fill capabilities. Embodiments of the method of the invention deposit such films using HDP-CVD deposition techniques and are useful for the manufacture of integrated circuits having minimum feature sizes of 0.18 microns or less.

In one embodiment, the method includes flowing a process gas that includes a silicon-containing source, an oxygen-containing source and a fluorine-containing source into a substrate processing chamber and forming a plasma from said process gas. The substrate is heated to a temperature above 450° C. during deposition of said silicon oxide layer and the deposited layer has a fluorine content of less than 1.0 atomic percent. In some embodiments, the plasma has an ion density of at least $1 \times 10^{11}$ ions/cm$^3$.

These and other embodiments of the present invention, as well as its advantages and features are described in more detail in conjunction with the text below and attached figures.

DETAILED DESCRIPTION OF SPECIFIC EMBODIMENTS OF THE INVENTION

I. Introduction

Embodiments of the present invention deposit a silicon oxide layer using high density plasma CVD techniques. The deposited layer has improved gap-fill capabilities as compared to some prior art silicon oxide deposition techniques. Films deposited by the method of the present invention are suitable for use in the fabrication of integrated circuits having feature sizes of 0.18 microns or less.

Embodiments of the present invention can be implemented using a variety of high density plasma CVD substrate processing chambers including chambers in which a plasma is formed by the application of RF energy to a coil that at least partially surrounds a portion of the chamber and chambers that use ECR plasma formation techniques. An example of an inductively-coupled HDP-CVD chamber in which embodiments of the method of the present invention can be practiced is set forth below.

II. Exemplary Substrate Processing System

Figure 1A:
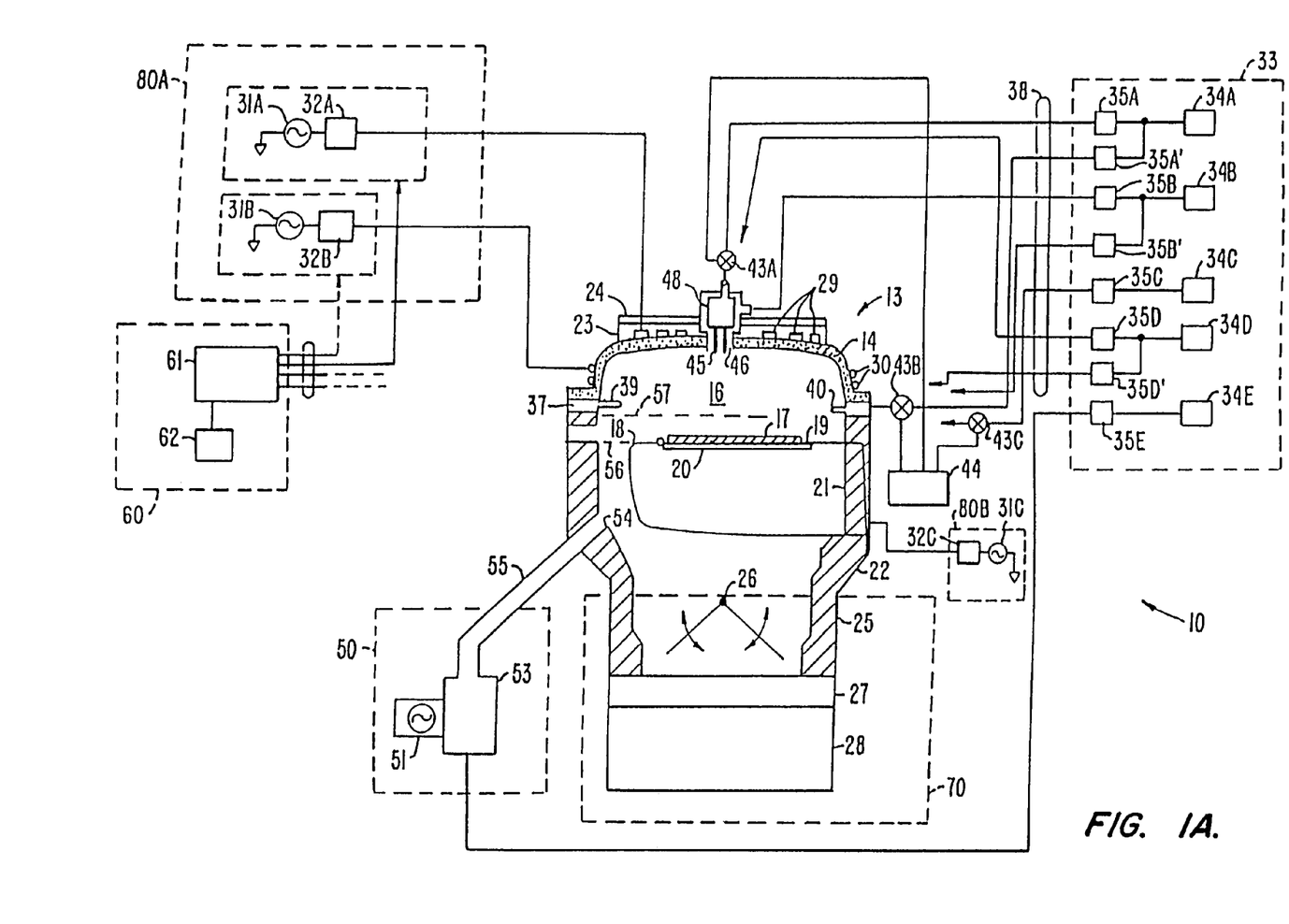
FIG. 1A is a simplified diagram of one embodiment of a high density chemical vapor deposition system according to the present invention.

FIG. 1A illustrates one embodiment of a high density plasma chemical vapor deposition (HDP-CVD) system 10 in which a dielectric layer according to the present invention can be deposited. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

Generally, exposure to the plasma heats a substrate positioned on substrate support 18. Substrate support 18 includes inner and outer passages (not shown) that can deliver a heat transfer gas (sometimes referred to as a backside cooling gas) to the backside of the substrate.

The lower portion of chamber 13 includes a body member 22, which joins the chamber to the vacuum system. A base portion 21 of substrate support 18 is mounted on, and forms a continuous inner surface with, body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate receiving portion 19 of substrate support 18. Substrate receiving portion 19 includes an electrostatic chuck 20 that secures the substrate to substrate support 18 during substrate processing. In a preferred embodiment, substrate support 18 is made from an aluminum oxide or aluminum ceramic material.

Vacuum system 70 includes throttle body 25, which houses twin-blade throttle valve 26 and is attached to gate valve 27 and turbo-molecular pump 28. It should be noted that throttle body 25 offers minimum obstruction to gas flow, and allows symmetric pumping, as described in co-pending, co-assigned U.S. patent application Ser. No. 08/574,839, filed Dec. 12, 1995, and which is incorporated herein by reference. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures from between about 1 mTorr to about 2 Torr.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to 2,500 watts of RF power at nominally 2 MHz and the side source RF generator 31B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF (BRF) generator 31C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to 5,000 watts of RF power at 13.56 MHz.

RF generators 31A and 31B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition. Other measures may also help stabilize a plasma. For example, the RF control circuit can be used to determine the power delivered to the load (plasma) and may increase or decrease the generator output power to keep the delivered power substantially constant during deposition of a layer.

Figure 1B:
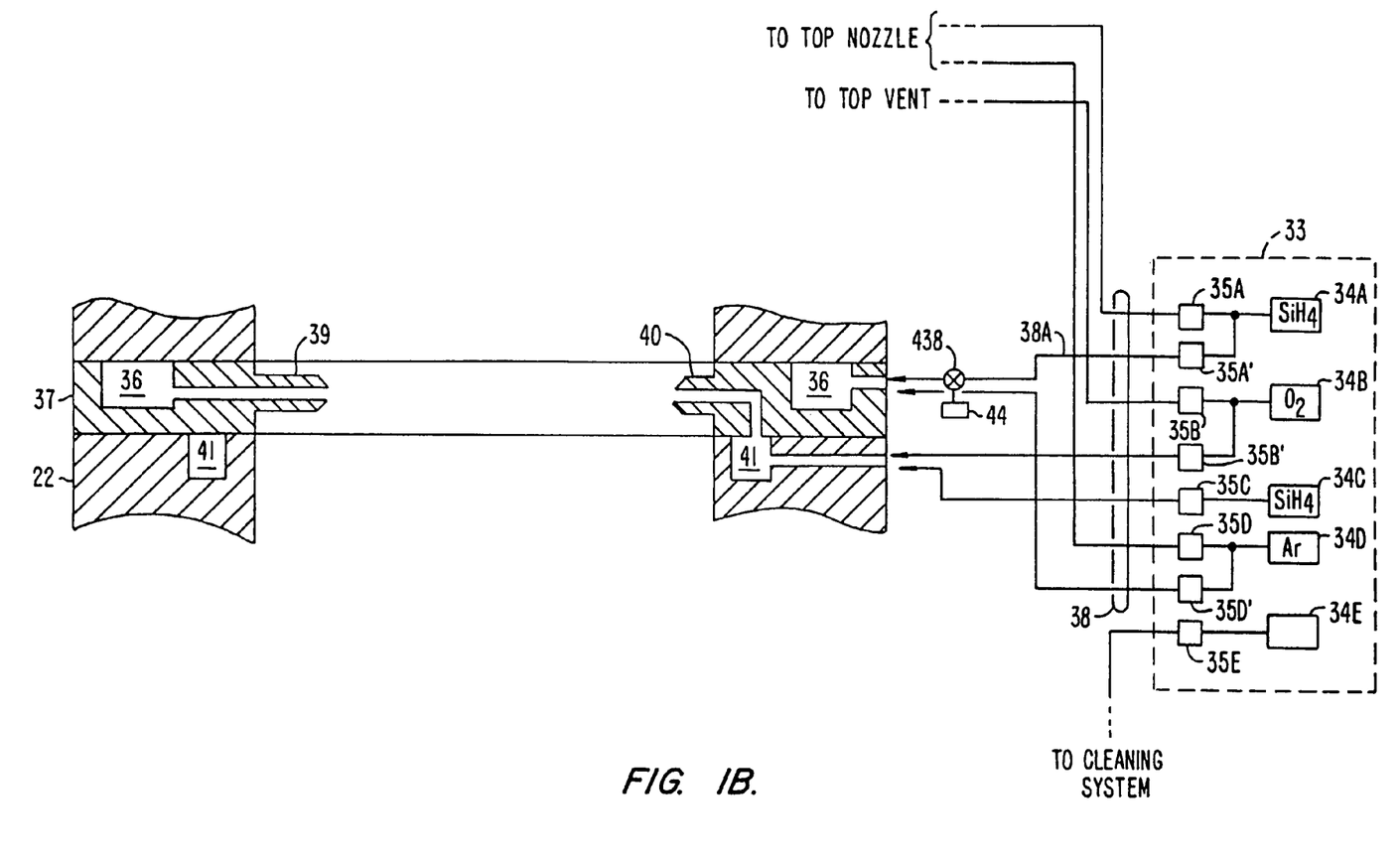
FIG. 1B is a simplified cross section of a gas ring that may be used in conjunction with the exemplary CVD processing chamber of FIG. 1A.

A gas delivery system 33 provides gases from several sources, 34A–34F chamber for processing the substrate via gas delivery lines 38 (only some of which are shown). As would be understood by a person of skill in the art, the actual sources used for sources 34A–34F and the actual connection of delivery lines 38 to chamber 13 varies depending on the deposition and cleaning processes executed within chamber 13. Gases are introduced into chamber 13 through a gas ring 37 and/or a top nozzle 45. FIG. 1B is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of gas nozzles 39 (only one of which is shown for purposes of illustration) that provides a uniform flow of gas over the substrate. Nozzle length and nozzle angle may be changed to allow tailoring of the uniformity profile and gas utilization efficiency for a particular process within an individual chamber. In a preferred embodiment, gas ring 37 has 12 gas nozzles 39 made from an aluminum oxide ceramic.

Gas ring 37 also has a plurality of gas nozzles 40 (only one of which is shown), which in a preferred embodiment are co-planar with and shorter than source gas nozzles 39, and in one embodiment receive gas from body plenum 41. Gas nozzles 39 and 40 are not fluidly coupled in some embodiments it is desirable not to mix gases before injecting the gases into chamber 13. In other embodiments, gases may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1A, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 1A, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process.

System controller 60 controls the operation of system 10. In a preferred embodiment, controller 60 includes a memory 62, such as a hard disk drive, a floppy disk drive (not shown), and a card rack (not shown) coupled to a processor 61. The card rack may contain a single-board computer (SBC) (not shown), analog and digital input/output boards (not shown), interface boards (not shown), and stepper motor controller boards (not shown). The system controller conforms to the Versa Modular European (VME) standard, which defines board, card cage, and connector dimensions and types. The VME standard also defines the bus structure as having a 16-bit data bus and 24-bit address bus. System controller 31 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube (CRT) 65, and a light pen 66, as depicted in FIG. 1C.

Figure 1C:
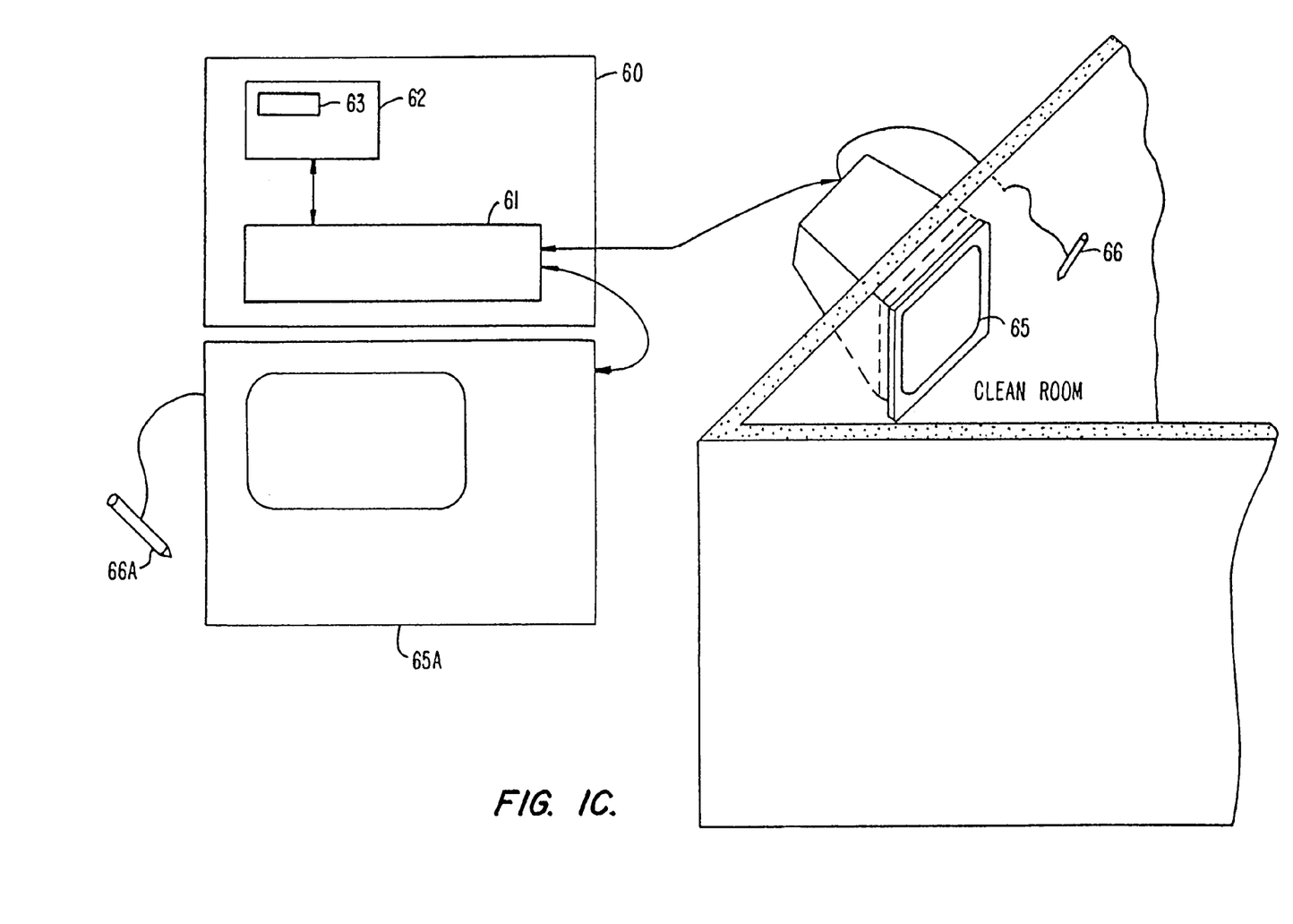
FIG. 1C is a simplified diagram of a monitor and light pen that may be used in conjunction with the exemplary CVD processing chamber of FIG. 1A.

FIG. 1C is an illustration of a portion of an exemplary system user interface used in conjunction with the exemplary CVD processing chamber of FIG. 1A. System controller 60 includes a processor 61 coupled to a computer-readable memory 62. Preferably, memory 62 may be a hard disk drive, but memory 62 may be other kinds of memory, such as ROM, PROM, and others.

System controller 60 operates under the control of a computer program 63 stored in a computer-readable format within memory 62. The computer program dictates the timing, temperatures, gas flows, RF power levels and other parameters of a particular process. The interface between a user and the system controller is via a CRT monitor 65 and a light pen 66, as depicted in FIG. 1C. In a preferred embodiment, two monitors, 65 and 65A, and two light pens, 66 and 66A, are used, one mounted in the clean room wall (65) for the operators and the other behind the wall (65A) for the service technicians. Both monitors simultaneously display the same information, but only one light pen (e.g. 66) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, or Pascal. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 1D:
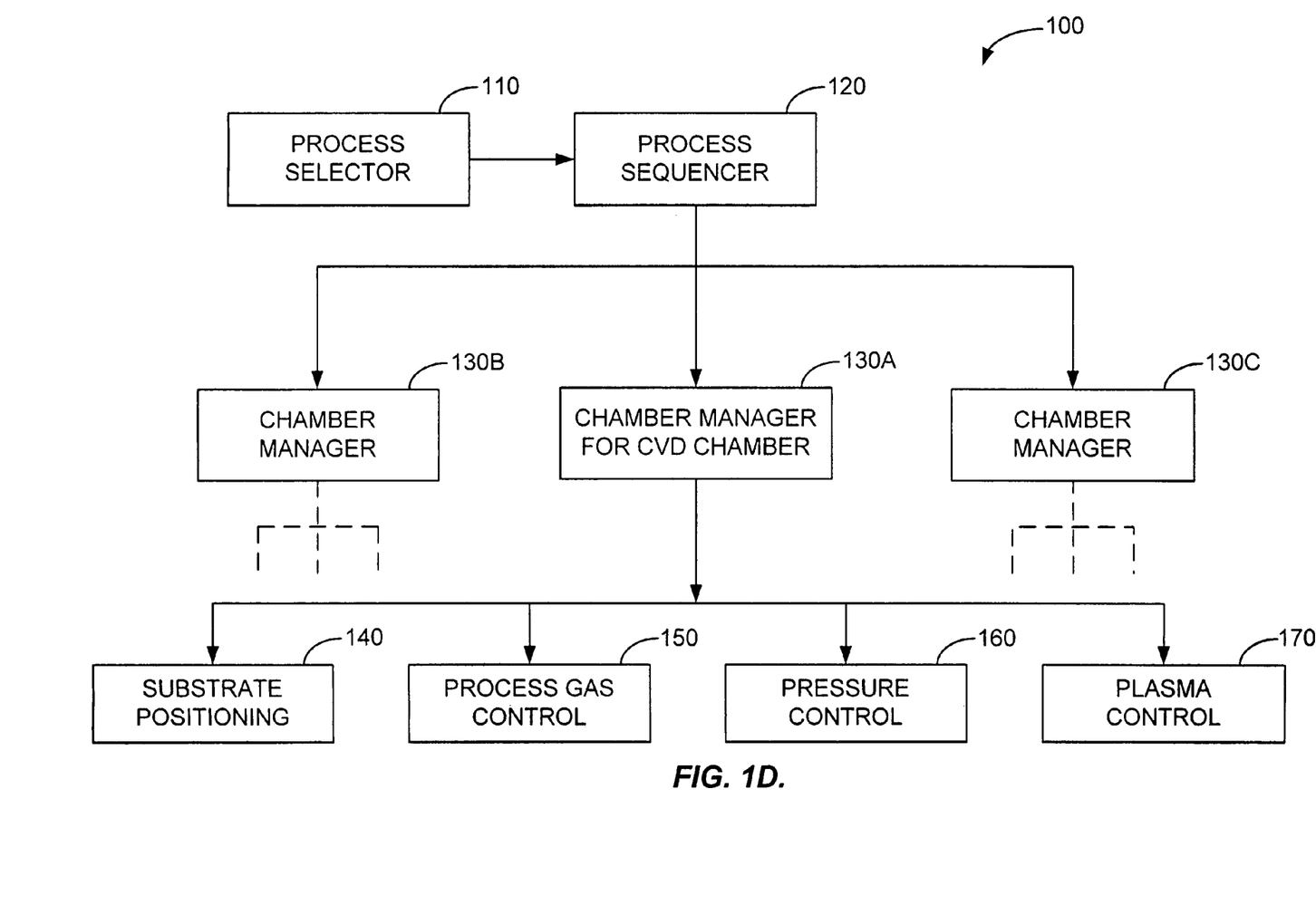
FIG. 1D is a flow chart of an exemplary process control computer program product used to control the exemplary CVD processing chamber of FIG. 1A.

FIG. 1D shows an illustrative block diagram of the hierarchical control structure of computer program 100. A user enters a process set number and process chamber number into a process selector subroutine 110 in response to menus or screens displayed on the CRT monitor by using the light pen interface. The process sets are predetermined sets of process parameters necessary to carry out specified processes, and are identified by predefined set numbers. Process selector subroutine 110 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 60, and the signals for controlling the process are output on the analog and digital output boards of system controller 60.

A process sequencer subroutine 120 comprises program code for accepting the identified process chamber and set of process parameters from the process selector subroutine 110 and for controlling operation of the various process chambers. Multiple users can enter process set numbers and process chamber numbers, or a single user can enter multiple process set numbers and process chamber numbers; sequencer subroutine 120 schedules the selected processes in the desired sequence. Preferably, sequencer subroutine 120 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 120 can be designed to take into consideration the "age of each particular user-entered request, or the present condition of the process chamber being used in comparison with the desired process conditions for a selected process, or any other relevant factor a system programmer desires to include for determining scheduling priorities.

After sequencer subroutine 120 determines which process chamber and process set combination is going to be executed next, sequencer subroutine 120 initiates execution of the process set by passing the particular process set parameters to a chamber manager subroutine 130A–C, which controls multiple processing tasks in chamber 13 and possibly other chambers (not shown) according to the process set sent by sequencer subroutine 120.

Examples of chamber component subroutines are substrate positioning subroutine 340, process gas control subroutine 150, pressure control subroutine 160, and plasma control subroutine 170. Those having ordinary skill in the art will recognize that other chamber control subroutines can be included depending on what processes are selected to be performed in chamber 13. In operation, chamber manager subroutine 130A selectively schedules or calls the process component subroutines in accordance with the particular process set being executed. Chamber manager subroutine 130A schedule process component subroutines in the same manner that sequencer subroutine 120 schedules the process chamber and process set to execute. Typically, chamber manager subroutine 130A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 1A and 1D. Substrate positioning subroutine 140 comprises program code for controlling chamber components that are used to load a substrate onto substrate support number 18. Substrate positioning subroutine 140 may also control transfer of a substrate into chamber 13 from, e.g., a PECVD reactor or other reactor in the multi-chamber system, after other processing has been completed.

Process gas control subroutine 150 has program code for controlling process gas composition and flow rates. Subroutine 150 controls the open/close position of the safety shut-off valves and also ramps up/ramps down the mass flow controllers to obtain the desired gas flow rates. All chamber component subroutines, including process gas control subroutine 150, are invoked by chamber manager subroutine 130A. Subroutine 150 receives process parameters from chamber manager subroutine 130A related to the desired gas flow rates.

Typically, process gas control subroutine 150 opens the gas supply lines, and repeatedly (i) reads the necessary mass flow controllers, (ii) compares the readings to the desired flow rates received from chamber manager subroutine 130A, and (iii) adjusts the flow rates of the gas supply lines as necessary. Furthermore, process gas control subroutine 150 may include steps for monitoring the gas flow rates for unsafe rates and for activating the safety shut-off valves when an unsafe condition is detected.

In some processes, an inert gas, such as argon, is flowed into chamber 13 to stabilize the pressure in the chamber before reactive process gases are introduced. For these processes, the process gas control subroutine 150 is programmed to include steps for flowing the inert gas into chamber 13 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 150 may include steps for bubbling a delivery gas such as helium through the liquid precursor in a bubbler assembly or for introducing the helium to a liquid injection valve. For this type of process, the process gas control subroutine 150 regulates the flow of the delivery gas, the pressure in the bubbler, and the bubbler temperature to obtain the desired process gas flow rates. As discussed above, the desired process gas flow rates are transferred to process gas control subroutine 150 as process parameters.

Furthermore, the process gas control subroutine 150 includes steps for obtaining the necessary delivery gas flow rate, bubbler pressure, and bubbler temperature for the desired process gas flow rate by accessing a stored table containing the necessary values for a given process gas flow rate. Once the necessary values are obtained the delivery gas flow rate, bubbler pressure and bubbler temperature are monitored, compared to the necessary values and adjusted accordingly.

The process gas control subroutine 150 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 160 includes program code for controlling the pressure in chamber 13 by regulating the size of the opening of throttle valve 26 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 26 to a fixed position. Setting throttle valve 26 to a fixed position may eventually result in a steady-state-pressure.

Alternatively, the chamber pressure may be measured, with a manometer for example, and the position of throttle valve 26 may be adjusted according to pressure control subroutine 360, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 160 is invoked, the desired, or target, pressure level is received as a parameter from chamber manager subroutine 130A. Pressure control subroutine 160 measures the pressure in chamber 13 by reading one or more conventional pressure manometers connected to the chamber; compares the measured value(s) to the target pressure; obtains proportional, integral, and differential (PID) values from a stored pressure table corresponding to the target pressure, and adjusts throttle valve 26 according to the PID values obtained from the pressure table. Alternatively, pressure control subroutine 160 may open or close throttle valve 26 to a particular opening size to regulate the pressure in chamber 13 to a desired pressure or pressure range.

Plasma control subroutine 170 comprises program code for controlling the frequency and power output setting of RF generators 31A and 31B and for tuning matching networks 32A and 32B. Plasma control subroutine 370, like the previously described chamber component subroutines, is invoked by chamber manager subroutine 330A.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in U.S. Pat. No. 6,170,428, issued Jan. 9, 2001, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

Figure 2:
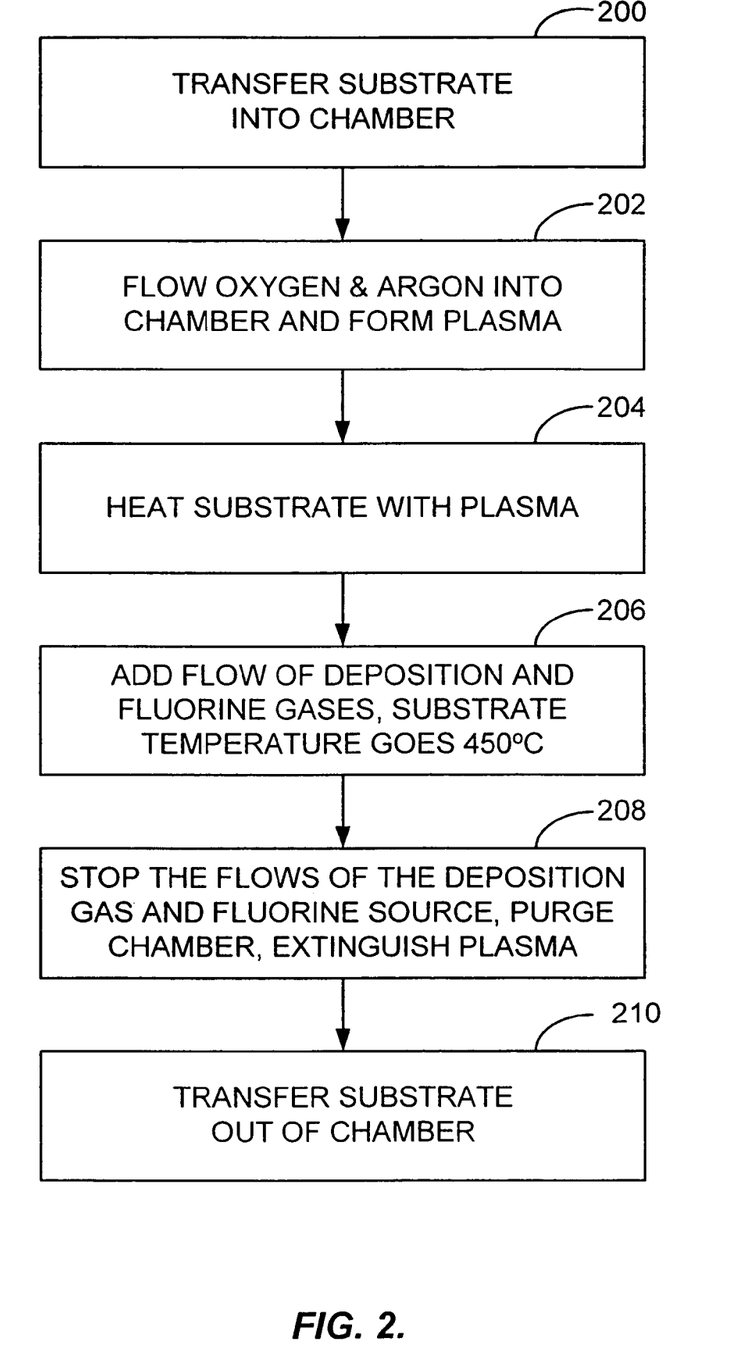
FIG. 2 is a flowchart illustrating one embodiment of the method of the present invention.

III. Depositing a Silicon Oxide Film According to Specific Embodiments of the Invention As previously stated, embodiments of the present invention can be practiced in an HDP-CVD chamber such as exemplary chamber 13 described above. FIG. 2 illustrates one particular embodiment of the invention as used to deposit an undoped silicon oxide film (USG) over a semiconductor substrate. The process is for exemplary purposes only and is not intended to limit the scope of the claims of the present invention. Where applicable, reference numbers in the description below are used to refer to appropriate components of the exemplary chamber of FIGS. 1A–1D. In this embodiment the process is implemented and controlled using a computer program stored in memory 62 of system controller 60.

As shown in FIG. 2, the substrate upon which an undoped silicon oxide layer is to be deposited according to the present invention is transferred into deposition chamber 13 in a step 200. Next, a flow of an oxygen source is introduced into the chamber and a plasma is formed (step 202). The plasma is used to heat the substrate before actual film deposition starts (step 204). Typically this heating step uses no bias RF power in order to ensure the underlying substrate features are not sputtered. The substrate is typically heated to a temperature between about 200–450° C. during step 204 but can be used to heat the substrate even further. In some embodiments, the substrate is heated by a plasma of an oxygen source and/or argon or a similar inert gas.

Next, flows of a silicon-containing source, such as a silane gas, and a fluorine-containing source are introduced into the deposition chamber to initiate deposition of the silicon oxide film and the RF bias power is turned ON (step 206). The length of the deposition process in step 206 is determined by the desired thickness of the silicon oxide film. In some embodiments, the flow of argon (if used) is also stopped during step 204. In these embodiments it is generally desirable, however, to maintain a flow of at least one common gas (e.g., oxygen) from step 202 to step 206 in order to improve plasma uniformity and/or prevent the plasma from being extinguished during the switch in gases introduced into the chamber.

The flow rate of the fluorine-containing source during step 206 is optimized as described in more detail below to achieve the best results for any given gap-fill situation. In some embodiments that are used to fill particularly high aspect ratio gaps, the flow rate of the fluorine source is higher than the flow rate of the silane gas. Also in some embodiments, the flow rate of the fluorine source is generally equal to or even higher than the flow rate used in HDP-CVD FSG processes that incorporate 4 at. % or more of fluorine into the deposited FSG film. Furthermore, in some embodiments the ratio of the flow rate of the oxygen-source to the silane gas is between 1.4 and 3.0 to 1 inclusive. At ratios below 1.4:1 the silicon oxide film becomes silicon rich, exhibits poor electrical breakdown characteristics and has an undesirably high refractive index. At ratios above 3.0:1, the relatively high gas flow rates required to achieve such ratios increases the chamber pressure to undesirably high levels which in turn degrades film gap-fill capabilities.

Table 1 below lists typical ranges for the primary deposition parameters in step 206, except for deposition temperature, according to one embodiment of the present invention. The substrate is continuously heated by the plasma during deposition step 206. This heating occurs rapidly because the bias power generates film sputtering and thus the temperature of the substrate quickly reaches 450° C. or higher, and more typically 500° C. or higher. In some embodiments where the layer being deposited is for an STI application, no temperature control is used during deposition of the layer in step 204. Instead, the substrate is allowed to be heated to as high a temperature as possible by the plasma. Generally in these embodiments the substrate temperature reaches between 650° C. and 750° C. In some embodiments where the layer being deposited is for a PMD application, backside cooling is employed to maintain the temperature of the substrate between 450° C. and 750° C. and more typically between 500° C. and 600° C. In Table 1 below, TVO means "throttle valve fully open" which results in chamber pressure being controlled by the quantity of gas flowed into the chamber.

TABLE 1

SiO$_2$ Deposition Process According to One Embodiment of the Invention

| Parameter | Value |
|---|---|
| SiH$_4$ flow | 50–150 sccm |
| O$_2$ flow | 1.4–3.0 times SiH$_4$ flow |
| NF$_3$ flow | 50–150 sccm |
| Pressure | 1–4 mTorr (TVO) |
| Top RF Power | 4000–5000 Watts (more aggressive gap-fill) |
| | 1300–4500 Watts (less aggressive gap-fill) |
| Side RF Power | 1800–4500 Watts (more aggressive gap-fill) |
| | 1800–4000 Watts (less aggressive gap-fill) |
| Bias RF Power | 1000–3500 Watts |

Once deposition is completed, flows of silane and the fluorine-source are stopped and the plasma is maintained for a brief period from the oxygen source to purge the chamber (step 208). Afterwards, the substrate is ready to be transferred from chamber 13 (step 210) to a next stage of processing.

The inventors have unexpectedly found that the deposition process shown in FIG. 2 results in deposition of silicon oxide films having a fluorine content of less than 1.0 at. % and in many embodiments usually less than 0.6 at. %. Thus, the silicon oxide films deposited according to the invention have properties characteristic of USG films rather than FSG films. The dielectric constant of films deposited to some embodiments of the invention is between 4.0 and 4.2, the wet etch rate is between 800–900 Å/min when etched in a 6:1 buffered oxide solution and the refractive index of the films is between 1.45 and 1.46.

The low percentage of fluorine incorporated into deposited film is despite using fluorine flow rates comparable to, and in some instances even above, those used in IMD deposition processes that result in the deposition of a fluorine-doped silicon oxide film having fluorine levels of 4.0 at. % fluorine or more. While not being limited to any particular theory, it is believed that at the high temperature used during the deposition process, the etch rate of the silicon oxide film in the fluorine chemistry is very high. Thus, most of the fluorine on the surface reacts with silicon to form volatile $SiF_4$ which is then pumped out of the chamber. Thus, very little fluorine is incorporated into the deposited silicon oxide film structure.

In one embodiment, the silane gas is $SiH_4$, the oxygen source is $O_2$ and the fluorine-containing source is $NF_3$. While the inventors believe that some benefits of the invention are possible with any of the known fluorine-containing sources commonly used in the semiconductor industry for chemical vapor deposition processes, including silicon tetrafluoride ($SiF_4$), the inventors found that, much to their surprise, some fluorine-containing sources enable considerably better gap-fill capabilities than others. Specifically, the inventors were able to completely fill certain high aspect ratio gaps when using nitrogen trifluoride ($NF_3$) as the fluorine source but were not able to fill the same gaps using $SiF_4$ as the fluorine source despite optimizing the $SiF_4$ process for improved gap-fill.

Most HDP-CVD deposition processes known to the inventors balance the flow of the deposition gas (e.g., silane in a silicon oxide process) with the bias power to optimize gap-fill capabilities of the film and still maintain an acceptable deposition rate. Generally and up to a limit, increasing the flow rate of the deposition gas results increases the deposition rate of the film to the detriment of the film's gap-fill capabilities and increasing the bias power results in improved gap-fill capabilities at the expense of deposition rate. Thus, process engineers typically balance these two criteria, among others, in STI and PMD applications to achieve optimal gap-fill results.

The addition of fluorine to the process gas in step 206 per the method of FIG. 2, adds an isotropic etch component that reduces film growth on the sidewalls of gaps. This, in turn, allows a sustained bottom-up growth pattern without premature closing (i.e., void formation) of the gap. The fluorine species generated by the plasma etch the silicon oxide film isotropically while the bias sputtering removes film anisotropically. Thus, the flow rate of the fluorine source provides an additional process control knob that controls the film growth profile, especially within the gap, enabling process engineers to optimize a process to fill more aggressive gaps than previously possible without the addition of fluorine.

The amount of isotropic etching can be independently controlled by the flow rate of the fluorine source. This etching component should be balanced along with the $SiH_4$ flow rate and bias power level to achieve an optimal, void free gap-fill process. Additionally in some embodiments, the fluorine flow is introduced after a thin layer of $SiO_2$ is grown (deposited) in step 206. The growth of a thin silicon oxide layer without flowing fluorine helps avoid sidewall adhesion degradation and clipping of the upper corner of the gaps being filled due to isotropic etching.

The fluorine etching control knob available in processes according to the invention is particularly useful since the inventors discovered that, at temperatures above 450° C., fluorine from the fluorine-source does not get incorporated into the deposited silicon oxide film. Thus, the gap-fill benefits achievable according to embodiments of the invention do not come at the expense of the inclusion of fluorine in the film. Also, the gap-fill capabilities of undoped silicon oxide films according to the present invention are considerably better than the gap-fill capabilities of HDP-CVD FSG films deposited for IMD applications.

While not being limited to any particular theory, it is believed that $NF_3$ is a superior source of fluorine than $SiF_4$ for the deposition method shown in FIG. 2 because the $SiF_4$ includes additional film-forming elements (silicon) that counteract the etchant properties of the fluorine. Other non-silicon fluorine sources that can be used to achieve superior gap-fill properties as compared to $SiF_4$ include fluorocarbons having a formula of $C_nF_{2n+2}$, where n is a positive integer such as $CF_4$, $C_2F_6$, $C_3F_8$, etc. Such fluorocarbons are less desirable in some embodiments used for STI applications because of their carbon content.

In order to better appreciate the benefits achievable by the silicon oxide deposition process shown in FIG. 2 it is useful to first understand some of the problems associated with a well known previously used HDP-CVD silicon oxide deposition process. This well known process deposits an undoped silicon oxide film from a process gas of $SiH_4$, $O_2$ and Ar and can be implemented in the exemplary chamber described above. One specific process that has been recommended in the past for PMD gap-fill applications employs the deposition conditions shown below in Table 1.

TABLE 2

PREVIOUSLY KNOWN HDP-CVD $SiO_2$ DEPOSITION PROCESS

| Parameter | Value |
|---|---|
| $SiH_4$ flow | 69 + 11 sccm |
| $O_2$ flow | 160 sccm |
| Pressure | 2–4 mTorr (TVO) |
| Temperature | 550° C. |
| Top RF Power | 4950 Watts |
| Side RF Power | 3500 Watts |
| Bias RF Power | 2000 Watts |

For the gas flow entries within Table 2 that include two numbers, the first number indicates the flow rate of the particular gas through side nozzles 39, 40 while the second number indicates the flow rate of the gas through top nozzle 45. Also, TVO means "throttle valve fully open" which results in chamber pressure being controlled by the quantity of gas flowed into the chamber.

Figure 3A:
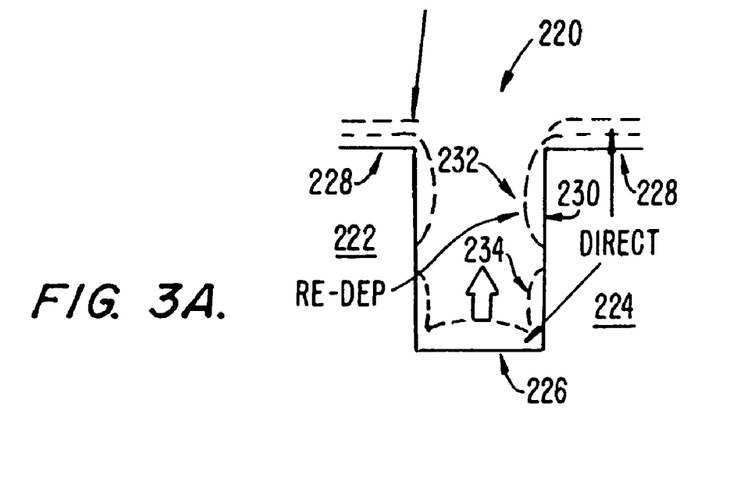
FIGS. 3A–3C are simplified cross-sectional views of a silicon oxide film at different stages of deposition within a narrow width, high aspect ratio gap according to a prior art silicon oxide deposition process.
Figure 3B:
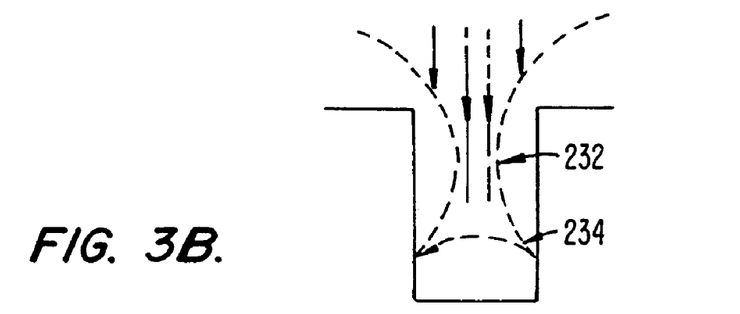
Figure 3C:
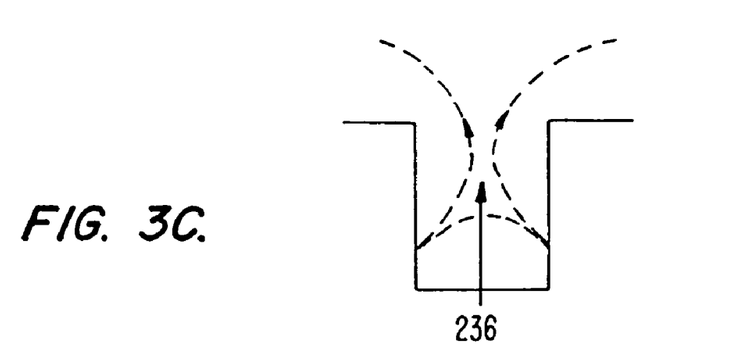

FIGS. 3A–3C, which are simplified cross-sectional views of a silicon oxide film at different stages of deposition, illustrate the potential gap-fill limitation that is associated with the process recipe of Table 2 for certain small-width gaps having relatively high aspect ratios. It is important to understand that while HDP-CVD silicon oxide deposition techniques generally provide for improved gap-fill as compared to other plasma silicon oxide deposition techniques including low density, capacitively coupled plasma CVD techniques, the gap-fill issues associated with those techniques become an issue for HDP-CVD techniques in certain aggressive gap-fill applications, for example, gaps having a width of 0.1 μm and a 5:1 aspect ratio. The gap-fill problem illustrated in FIGS. 3A–3C is somewhat exaggerated in order to better illustrate the problem.

FIG. 3A shows the initial stages of film deposition over a substrate (not shown) having a gap 220 defined by two adjacent features 222, 224 formed over the substrate. As shown in FIG. 3A, the conventional HDP-CVD silicon oxide deposition process results in direct silicon oxide deposition on horizontal surface 226 within gap 220 and horizontal surfaces 228 above features 222, 224. The process also results in indirect deposition (referred to as re-deposition) of silicon oxide on sidewalls 230 due to the recombination of material sputtered from the silicon oxide film as it grows. In certain small-width, high-aspect-ratio applications, the continued growth of the silicon oxide film results in formations 232 on the upper section gap sidewall that grow toward each other at a rate of growth exceeding the rate at which the film grows laterally on lower portions 234 of the sidewall (see FIG. 3B also). The final result of this process is that a void 236 forms as shown in FIG. 3C.

The deposition process discussed with respect to FIG. 2 has improved gap-fill capabilities as compared to those of the conventional film outlined in Table 2. The inventors have run a number of experiments and determined that films deposited according to the method of FIG. 2 and optimized for aggressive gap-fill applications can fill a number of gaps that the inventors were not able to fill using other known and optimized HDP-CVD silicon oxide deposition processes including the process shown in Table 2. For example, using the process of Table 2 the inventors were not able to completely fill gaps having a 5:1 aspect ratio and a width of 0.1 micron. Using the method of FIG. 2, however, and a process gas of $SiH_4$, $O_2$, and $NF_3$, the inventors were able to completely fill the same width gaps (0.1 microns) having an aspect ratio of up to 8:1.

Figure 4A:
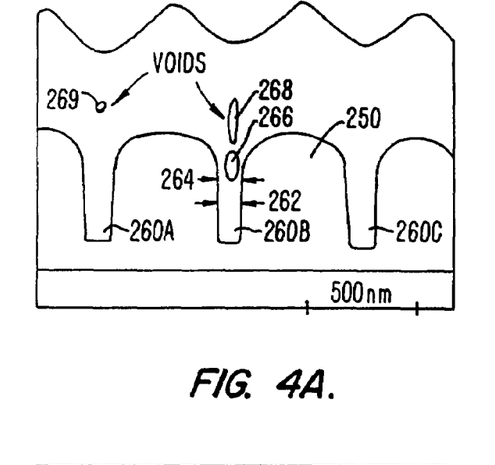
FIGS. 4A and 4B are a simplified cross-sectional view of the gap-fill capability of a silicon oxide film deposited according to a previously known HDP-CVD process.
Figure 4B:
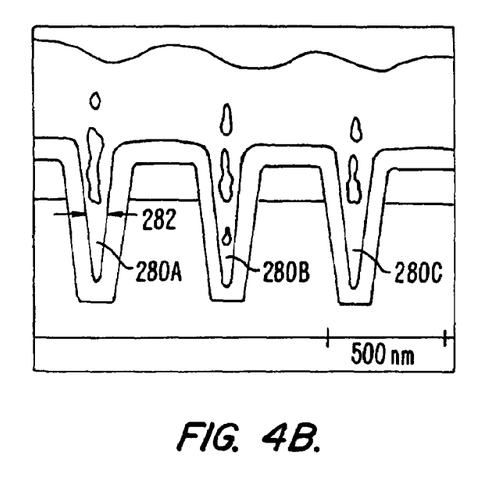
Figure 5A:
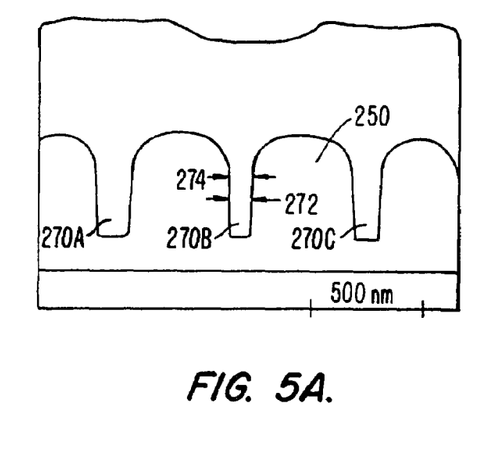
FIGS. 5A and 5B are a simplified cross-sectional view of the gap-fill capability of a silicon oxide film deposited, according to embodiments of the present invention, over the same gaps as those shown in FIGS. 4A and 4B.
Figure 5B:
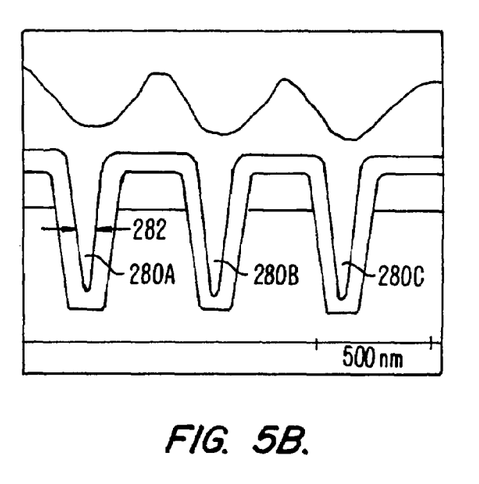

A comparison of FIGS. 5A and 5B to FIGS. 4A and 4B illustrates the benefits of a deposition process according to FIG. 2 as compared to a process according to Table 2. FIGS. 5A and 5B are a simplified cross-sectional view of a silicon oxide film deposited according to FIG. 2. In FIG. 4A, the film is deposited over a substrate having multiple sets of raised features 250 defining 0.09 μm wide gaps 260A, 260B and 260C. The height of gaps 260A–C is 0.5 μm so the aspect ratio of gaps 260A–C is approximately 5.6:1. As shown in FIGS. 4A and 4B, middle gap 260B has a reentrant profile (a width 264 of an upper portion of gap 260B is wider than a width 262 of a lower portion of gap 260B) making it particularly difficult to fill. As evident from FIG. 4A, the silicon oxide film is not able to completely fill reentrant gap 260B without the formation of voids 266 within the gap and void 268 just above the gap. Similarly, while no void is formed in gap 260A, the deposition process results in a surface topology that includes an unfilled areas 270 near the upper strata of gap 260A.

In contrast, FIG. 5A shows deposition of an HDP-CVD silicon oxide film according to the process of FIG. 2 over 0.09 μm gaps 270A–C having aspect ratios identical to the respective gaps 260A–C in FIG. 4A. Furthermore, gap 270B has a similar reentrant profile as gap 260B with a width 274 of an upper portion of the gap being less than a width 272 of a lower portion of the gap. As evident from FIG. 5A, the film deposited according to the process of FIG. 2 has superior gap-fill capabilities as compared to the film of FIG. 4A. Gaps 270A–C are completely filled without voids in or above the gaps 270.

Further evidence of the superiority of the process of FIG. 2 as compared to that of Table 1 is evident from a comparison of FIG. 5B to FIG. 4B. The substrates shown in FIGS. 4B and 5B include trenches 280A–C having a widths of 0.1 μm at the top of the trench and a width as low as 0.02 μm at the bottom of the trench. The midpoint 282 of trenches 280A–C has a width of about 0.05 μm and the height of the trenches is 0.55 μm. Using the width of the trench at midpoint 282 to calculate its aspect ratios, as is commonly done, the aspect ratio of trenches 280 is 11.0:1. As evident from the figures, however, the film deposited according to the process of FIG. 2 (FIG. 5B) does not include any voids within the gaps and thus has superior gap-fill capabilities as compared to the film deposited according to the process of Table 1 (FIG. 4B).

Deposition conditions for the films deposited with respect to the experiments of FIGS. 5A and 5B are listed below in Table 3. As with Table 2, when two numbers are listed for a gas flow variable, the first number is the flow from the side gas nozzles while the second number is the flow from the top gas nozzle.

TABLE 3

| FIG. 5A AND 5B DEPOSITION CONDITIONS | | |
|---|---|---|
| Parameter | FIG. 5A Value | FIG. 5B Value |
| $SiH_4$ flow | 60 + 18 sccm | 50 + 18 sccm |
| $O_2$ flow | 156 sccm | 136 sccm |
| $NF_3$ flow | 100 sccm | 90 sccm |
| Pressure | TVO | TVO |
| Top RF Power | 4950 Watts | 4950 Watts |
| Side RF Power | 3500 Watts | 3500 Watts |
| Bias RF Power | 2500 Watts | 2600 Watts |

Figure 6:
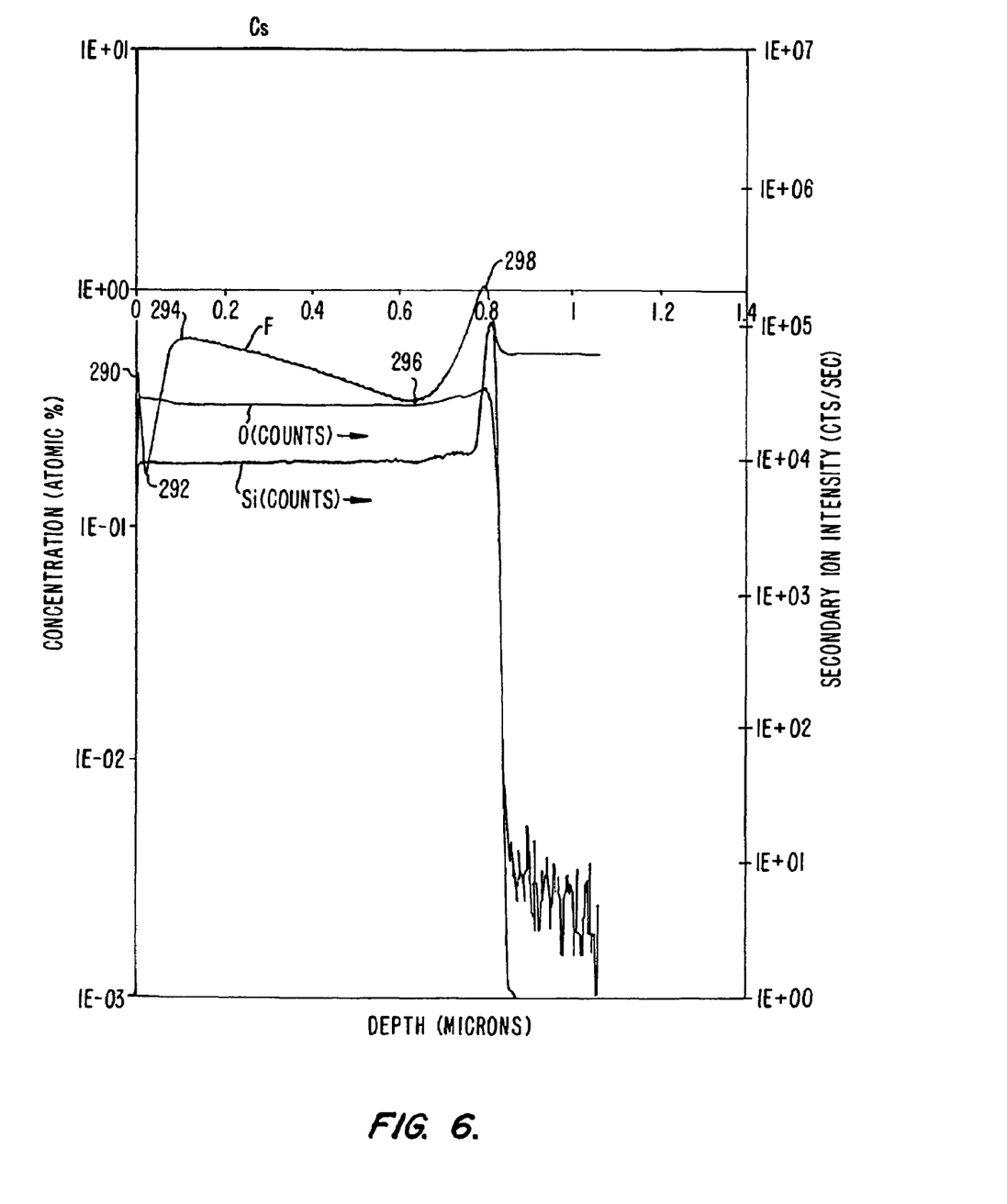
FIG. 6 is a graph showing the fluorine content of the silicon oxide film shown in FIG. 5A.

FIG. 6 is a graph showing the fluorine concentration in the gaps 270A–C of an 8000 Å silicon oxide film deposited to according to the method of the present invention and discussed with respect to FIG. 5A. The measurements in FIG. 6 were taken using Secondary Ion Mass Spectrometry (SIMS) analysis techniques as are known to those of skill in the art. The Y-axis on the left side of FIG. 6 is the scale for fluorine content in atomic percent while the Y-axis on the right side of FIG. 6 is the scale for silicon and oxygen content in counts. As indicated in FIG. 6, the fluorine content of the silicon oxide layer varies through the depth layer. The fluorine content is 0.43 at. % at the film surface (point 290), 0.17 at. % at a depth of 250 Å (point 292), 0.63 at. % at a depth of 1260 Å (point 294), 0.34 at. % at a depth of 6400 Å (point 296) and 1.03 at. % at a depth of 8000 Å (point 298). Fluorine content levels from the SIMS tests were measured approximately every 31 Å (a total of 259 data points were taken from within the 8000 Å layer). The average fluorine content of these measurements throughout the layer was 0.485 at. %. This relatively low fluorine content level was achieved despite using an $NF_3$ flow rate (100 sccm) that was considerably higher than the $SiH_4$ flow rate (60+18 sccm).

The process parameters set forth above with respect to the embodiments above are optimized for particular deposition processes run in an Ultima HDP chamber manufactured by Applied Materials that is outfitted for 200 mm wafers. A person of ordinary skill in the art will recognize that these preferred parameters are in part chamber specific and will vary if chambers of other design and/or volume are employed. Also, the atomic percent values listed above are values measured by Auger analysis as is known to those of skill in the art.

The parameters listed in the above preferred processes and the above-described experiments should not be limiting to the claims as described herein. One of ordinary skill in the art can also use parameters and conditions other than those described with respect to specific embodiments. For example, while the invention was described above with respect to an HDP-CVD process, it is believed to be useful for other types of plasma CVD processes. Also, the invention was described with respect to an undoped silicate glass layer, the invention can also be used to improve the gap-fill capabilities of phosphosilicate glass (PSG), boron-doped silicate glass (BSG) and boron phosphosilicate glass (BPGS) layers as well. For such films, a dopant gas such as $PH_3$ and/or $B_2H_6$ is added to the process gas in step 206. Additionally, initial heat up steps 202 and 204 are not necessary for all embodiments. For example, in some embodiments a plasma is formed from silicon and oxygen-containing deposition gases introduced into the chamber to deposit and initial thin layer of the silicon oxide film. As the substrate temperature increases then, the fluorine source is subsequently introduced into the plasma. Also, in other embodiments, an oxygen-containing gas such as $N_2O$, $O_3$ or $CO_2$ can be used. As such, the above description is illustrative and not restrictive. The scope of the invention should, therefore, be determined not with reference to the above description, but instead should be determined with reference to the appended claims along with their full scope of equivalents.

What is claimed is:

1. A method for forming a silicon oxide layer over a substrate disposed in a high density plasma substrate processing chamber, said method comprising:
   flowing a process gas into the substrate processing chamber, said process gas comprising a silicon containing source, an oxygen-containing source and $SiF_4$;
   forming a high-density plasma from said process gas; and
   heating the substrate to a temperature above 450° C. during deposition of said silicon oxide layer, wherein said silicon oxide layer has a fluorine content of less than 1.0 at. %.

2. The method of claim 1 wherein the substrate is heated to a temperature above 500° C. during deposition of said silicon oxide layer.

3. The method of claim 1 wherein the substrate is maintained at a temperature between 500–600° C. during deposition of said silicon oxide layer.

4. The method of claim 1 wherein said silicon containing gas is $SiH_4$.

5. The method of claim 1 wherein said oxygen-containing source is $O_2$.

6. The method of claim 1 wherein a flow ratio of said oxygen containing source to said silicon-containing source is between 1.4–3.0:1 inclusive.

7. A method for forming a silicon oxide layer over a substrate disposed in a high density plasma substrate processing chamber, said method comprising:

(a) flowing a first gas into the substrate processing chamber;

(b) forming a plasma having an ion density of at least $1\times10^{11}$ ions/cm$^3$ from said first gas and allowing said plasma to heat said substrate;

(c) thereafter, flowing a process gas comprising a silicon containing source, an oxygen-containing source and SiF4 into said substrate processing chamber; and (d) forming a plasma having an ion density of at least $1\times10^{11}$ ions/cm$^3$ from said process gas and allowing said plasma to heat said substrate to a temperature at or above 450° C. during deposition of said silicon oxide layer, wherein said silicon oxide layer has a fluorine content of less than 1.0 at. %.

8. The method of claim 7 wherein said oxygen-containing source is $O_2$ and said silicon containing source is $SiH_4$.

9. The method of claim 8 wherein said first gas comprises one or more of argon and $O_2$.

10. The method of claim 7 wherein a flow ratio of said oxygen containing source to said silicon-containing source is between 1.4–3.0:1 inclusive.

11. The method of claim 7 wherein in (d) said plasma heats said substrate to a temperature of 500° C. or more.

12. A method for forming a silicon oxide layer over a substrate disposed in a high density plasma substrate processing chamber, said method comprising:

(a) flowing a first gas comprising at least one of an inert gas and $O_2$ into the substrate processing chamber;

(b) forming a plasma having an ion density of at least $1\times10^{11}$ ions/cm$^3$ from said first gas and allowing said plasma to heat said substrate;

(c) thereafter, depositing said silicon oxide layer by flowing a process gas comprising $SiH_4$, $O_2$ and $SiF_4$ into said substrate processing chamber while maintaining said plasma and allowing said plasma to heat said substrate to a temperature above 450° C. during deposition of said silicon oxide layer;

wherein said silicon oxide layer has a fluorine concentration of 1.0 at. % or less.

13. The method of claim 12 wherein said silicon oxide layer has a fluorine content of 0.6 at. % or less.

14. The method of claim 13 wherein a flow rate of said $SiF_4$ is greater than or equal to a flow rate of $SiH_4$.

\* \* \* \* \*